United States Patent [19]

Jones

[11] Patent Number: 4,612,772
[45] Date of Patent: Sep. 23, 1986

[54] THERMO-ELECTRIC TEMPERATURE CONTROLLER FOR LIQUID CHEMICAL BUBBLER CONTAINERS

[76] Inventor: David E. Jones, 16533 Grove Creek Cir., Pecatonica, Ill. 61063

[21] Appl. No.: 794,681

[22] Filed: Nov. 4, 1985

[51] Int. Cl.$^4$ ............................................. F25B 21/02
[52] U.S. Cl. ............................................................. 62/3
[58] Field of Search ............................................. 62/3

[56] References Cited

U.S. PATENT DOCUMENTS 4,487,619  12/1984  Jones ........................................... 62/3
4,512,758  4/1985  Wedemeyer et al. ...................... 62/3

Primary Examiner—Lloyd L. King
Attorney, Agent, or Firm—Vernon J. Pillote

[57] ABSTRACT

A thermo-electric temperature controller for a liquid chemical bubbler container in which a thermally conductive platform in the housing is heated or cooled by thermo-electric devices for heating or cooling a liquid chemical bubbler container to maintain a preset temperature. The housing is formed with a side opening door to provide an access opening which allows installation and removal of the bubbler container laterally of the housing into a position on the thermally conductive platform. A heat exchanger is provided for the side walls of the bubbler container and includes a first semi-cylindrical section that is mounted at its lower end on the thermally conductive container support platform in heat exchange relation therewith and which extends upwardly around the side walls of the bubbler container, and a second movable heat exchange section which can be moved laterally through the access opening in the housing into opposed relation with the first heat exchange section to form a heat exchange enclosure therewith. The adjacent side edges of the first and second heat exchange members are formed so as to provide interengaging cams arranged to cam the second heat exchange member laterally toward the first heat exchange member as the second heat exchange member moves downwardly into engagement with the thermally conductive container support platform.

11 Claims, 4 Drawing Figures

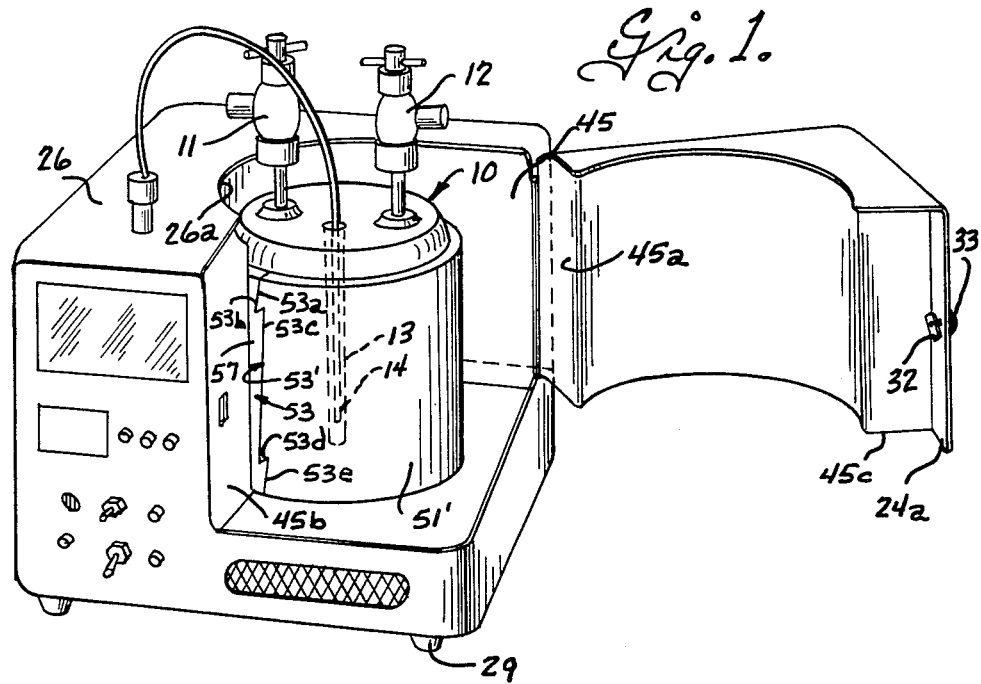
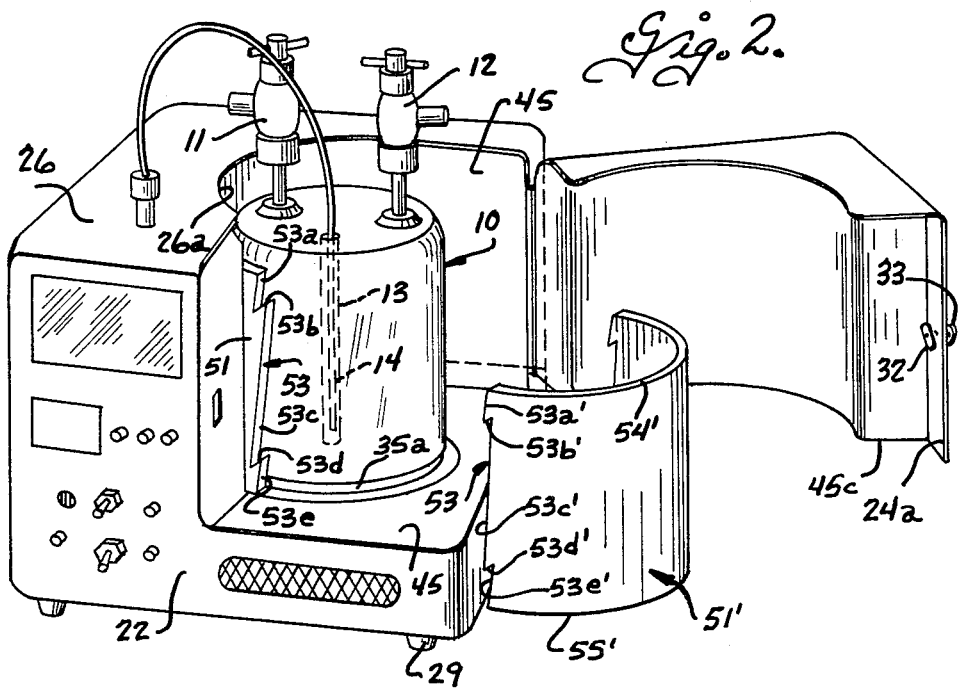

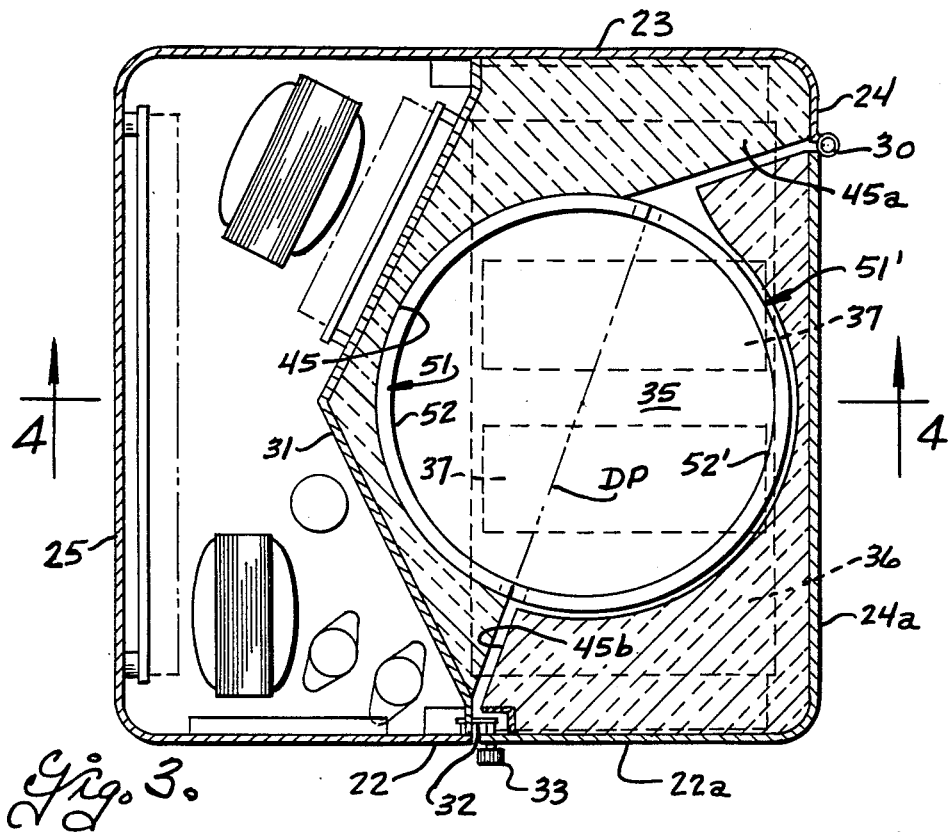
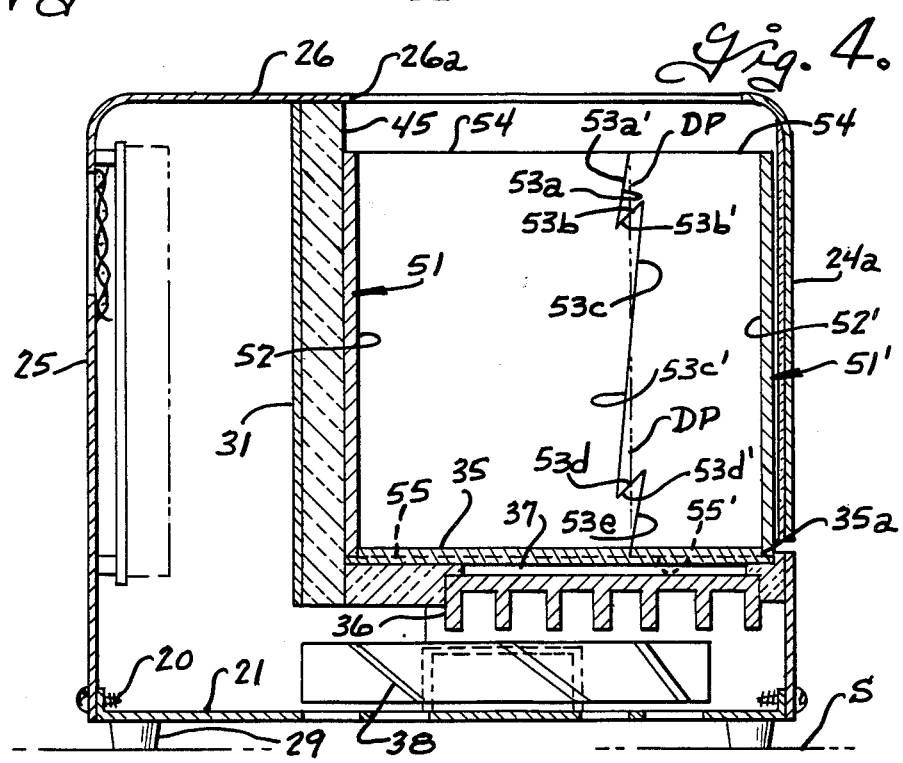

THERMO-ELECTRIC TEMPERATURE CONTROLLER FOR LIQUID CHEMICAL BUBBLER CONTAINERS

BACKGROUND OF THE INVENTION

Various chemical compounds, commonly referred to as dopants, are utilized in semi-conductor device fabrication. In general, the liquid dopant source material is stored in a bubbler container having gas inlet and outlet fittings at its top, and a carrier gas is passed through the inlet and bubbles through the liquid dopant in the bubbler container before passage into the bubbler outlet. The vapor pressure of the liquid dopant varies with temperature and it is necessary to maintain the liquid dopant in the bubbler container at a substantially constant preset temperature to control dopant level in the semi-conductor processing furnace.

In a typical installation, the source bubblers are placed on shelves in a gas cabinet at one end of the furnace tubes of the semi-conductor processing furnace. The furnace tubes are heated to a very high temperature, commonly of the order of 1000° C., and the radiant heat from the furnace tubes raises the temperature in the gas cabinet and aggravates the problem of maintaining the liquid dopant source material at a preset temperature. Further, the shelves in the gas cabinet are commonly spaced apart a distance of the order of about twelve inches and this limits the permissible overall height of the temperature controller with the bubbler container installed.

Top loading type thermo-electric temperature controllers for bubbler containers have heretofore been made having an open top well for receiving the bubbler container and which well was heated or cooled by thermo-electric devices to control the temperature of the contents of the bubbler container. The container receiving wells included a container support platform of thermally conductive material disposed in heat exchange relation with thermo-electric devices to be cooled or heated thereby, and a sleeve of thermally conductive material that extended upwardly from the platform around the bubbler container to enhance heat transfer to and from the bubbler container and also shield the sides of the bubbler container from the temperature of the surrounding atmosphere. However, such top loading thermo-electric temperature controllers require a very high overhead clearance above the top of the temperature controller in order to enable installation and removal of the bubbler container from the well, and this limited their usefulness in applications where the clearance over the top of the temperature controller is limited.

Thermo-electric controllers for bubbler containers have also heretofore been made, as disclosed in U.S. Pat. No. 4,487,619, in which the housing was formed with a side opening door to allow installation and removal of the bubbler container from the side of the temperature controller. Since the bubbler containers can be loaded and unloaded from the side of the temperature controller, such temperature controllers require only a small overhead clearance sufficient to accommodate the fittings and tubes for the bubbler container. However, such prior side loading thermo-electric temperature controllers cooled or heated the bubbler container only through contact with the bottom of the bubbler container and relied upon thermal insulation material on the inner sides of the housing and door to reduce heat transfer between the bubbler container and the surrounding atmosphere.

SUMMARY OF THE INVENTION

It is an object of the present invention to overcome the problems encountered with prior thermo-electric temperature controllers for bubbler containers by providing a side opening thermo-electric temperature controller having an improved heat exchanger for surrounding the side walls of the bubbler container, and in which one side of the heat exchanger can be opened and closed to allow installation and removal of the bubbler container from the side of the temperature controller.

Another object of this invention is to provide a side opening temperature controller having a two-section heat exchanger for surrounding the side walls of the bubbler container, and which has an improved arrangement for releasably interconnecting the heat exchange sections.

Accordingly, the present invention provides a thermo-electric temperature controller for liquid chemical bubbler containers of the type having a bottom wall, a generally cylindrical side wall and a top wall with inlet and outlet fittings. The temperature controller includes a housing for enclosing the bubbler container and having a top wall and side wall means extending downwardly around the perimeter of the top wall. A thermally conductive platform is mounted in the housing for supporting a bubbler container, and means including at least one thermo-electric device having a first thermal junction in heat exchange relation with the platform and a second thermal junction in heat exchange relation with an ambient heat exchanger, is provided for cooling or heating the platform. The housing has an opening above the platform to allow the inlet and outlet fittings of the bubbler container to extend therethrough and the housing includes a door portion movable laterally of the housing between a closed position and an open position providing an access opening in the housing of a size sufficient to allow movement of the bubbler container laterally into and out of the housing. The temperature controller includes a heat exchanger for the side walls of the bubbler container and formed by first and second heat exchange members of thermally conductive material and each having a concave semi-cylindrical inner side face, a pair of lengthwise extending side edges and upper and lower end edges. The first heat exchange member has its lower end mounted on the container support platform in heat exchange relation therewith and with its concave inner side facing towards the access opening in the housing to extend around one side of the bubbler container on the platform, the second heat exchange member being movable through the access opening in the housing into an enclosure forming position in which the concave inner side face of the second heat exchange member is in opposed relation with the concave inner side of the first heat exchange member to form a cylindrical heat exchange closure therewith. A means is provided for releasably retaining the second heat exchange member in the enclosure forming position with the side edges of the first and second heat exchange members in heat exchange relation with each other and with the lower end of the second heat exchange member in heat exchange relation with the platform.

In the preferred embodiment shown, the side edges of the first and second heat exchange members define longitudinally zigzag lines that are complementary to each other to interfit and form a generally continuous cylindrical wall when the second heat exchange member is in its enclosure forming position. The side edges of the first heat exchange member each have at least one portion that defines an upwardly facing cam surface that is inclined downwardly and inwardly of the first heat exchange member, and the side edges of the second heat exchange member each have at least one portion that defines a downwardly facing cam surface that is inclined upwardly and inwardly of the second heat exchange member the cam surfaces are constructed and arranged to allow the second heat exchange member to gravitationly move downwardly and cam the second heat exchange member laterally toward the first heat exchange member as the second heat exchange member moves downwardly to the enclosure forming position.

DESCRIPTION OF THE DRAWINGS

FIG. 1 is a perspective view of a temperature controller for a liquid chemical bubbler container embodying the present invention;

FIG. 2 is a perspective view of the temperature controller of FIG. 1, showing one section of the heat exchanger in a moved position;

FIG. 3 is a horizontal sectional view through the temperature controller; and

FIG. 4 is a vertical sectional view taken on the plane 4—4 of FIG. 3.

The temperature controller is especially constructed and arranged for use in controlling the temperature of bubbler containers 10 for liquid chemical source material used in the fabrication of semi-conductive devices. In general, the bubbler containers are of generally cylindrical configuration and have a flat bottom wall, a cylindrical side wall and valved gas inlet and outlet fittings 11 and 12 at the top. In use, the carrier gas is passed into the inlet fitting 11 and down through an internal tube in the bubbler container to the bottom of the container and the carrier gas bubbles up to the liquid chemical source material in the container and becomes saturated before passing through the outlet fitting 12 to the furnace tubes. The vapor pressure of the liquid dopant varies with temperature and it is necessary to maintain the liquid dopant in the bubbler at a preset temperature to control the amount of liquid vapor in the carrier gas. Such bubblers also commonly have a temperature sensing well 13 that extends downwardly into the container from its top and which is arranged to receive a temperature sensing probe 14. Bubbler containers are commonly formed of quartz or glass, but metal such as stainless steel can be used for some of the liquid dopants. The bubbler containers come in different sizes from 500 to 1500 cc. The diameter of the bubbler containers varies from about 3.5 inches for the 500 cc bubbler container to 5.5 inches for the 1500 cc glass bubbler container, but the different size bubbler containers have substantially the same height of about 5.1 inches exclusive of the inlet and outlet fittings, and an overall height of about 9.0 inches including the valved inlet and outlet fittings.

The temperature controller includes a housing having side opening door means to enable movement of the bubbler container laterally into and out of the temperature controller housing. The temperature controller housing is preferably constructe and arranged in a manner more fully disclosed in U.S. Pat. No. 4,487,619, the disclosure of which is incorporated herein by reference.

The temperature controller preferably has a generally rectangular housing including a bottom wall 21, upstanding front and rear walls 22, 23, first and second end walls 24, 25, and a top wall 26. The housing is advantageously formed of metal for heat resistance and durability and the bottom wall is attachably secured to the upstanding side walls of the housing as by screws 20 that extend into flanges on the bottom wall. Feet 29 are provided on the bottom wall and support the bottom wall spaced above the supporting surface such as a shelf S (FIG. 4). The top wall of the housing has a opening 26a to allow the inlet and outlet fittings of the bubbler container to extend therethrough. The housing includes a door portion that is movable laterally of the housing between a closed position as shown in FIG. 3, and an open position as shown in FIGS. 1 and 2, providing an access opening in the side wall of the housing of a size sufficient to allow movement of the bubbler container laterally into and out of the housing. The door is preferably arranged to open at the front and side of the housing and, as shown, portions 22a and 24a of the front and side walls 22 and 24 respectively and the contiguous portions of the top wall of the housing form a generally L-shaped door which is hinged at its rear edge by hinges 30. A latch 32 operated by a knob 33 is provided for locking the door in a closed position.

The housing is also preferably arranged to also provide an enclosure for the control circuitry for the thermo-electric device. For this purpose, an upright partition 31 extends between the front and rear walls 22 and 23 of the housing and separates the housing into a container receiving compartment between the partition and the end wall 24, and electric components compartment between the partition and the end wall 25. Platform 35 formed of a thermally conductive material such as copper or aluminum, is disposed in the container receiving compartment at a level spaced above the bottom wall 21 and below the top wall 26 to support the container in the container receiving compartment with the body of the container at a level below the top wall and with the valved inlet and outlet fittings 11 and 12 extending above the top wall 26. A heat sink 36 is disposed below the platform 35 and thermo-electric semi-conductor devices 37, herein shown two in number, are interposed between the thermally conducted platform 35 and have one thermal junction in heat exchange relation with the platform 35 and the other thermal junction in heat exchange relation with the heat sink 36. The thermo-electric devices may, for example, be mounted to the platform 35 and heat sink 36 in heat conductioning relation therewith by epoxy cement. The thermo-electric devices 37 are semi-conductor devices that operate on the Peltier effect and which are operative to effect cooling of the platform 35 while heating the heat sink at the other side, when current is passed in one direction therethrough and which are operative to heat the platform 35 and cool the heat sink 36, when current is passed therethrough in the opposite direction. The thermo-electric devices can therefore be used to either heat or cool the bubbler container 10, as required to establish and maintain a preset temperature. As shown in FIGS. 1 and 2, the bubbler container 10 is positioned on the platform 35 of the thermo-electric heating and cooling apparatus and the temperature sensing device 14 is inserted into the temperature well 13 in the container to sense the temperature of the source material in the bubbler container. As disclosed more fully in the aforementioned U.S. Pat. No. 4,487,619, an electrical signal correlative with the temperature sensed by the sensing device 14 is compared with a signal from a manually adjustable temperature set point and the control circuit operates to supply a DC output to the thermo-electric devices 37 having a polarity and amplitude correlative with the direction and amount that the sensed temperature deviates from the set point and to pass current therethrough in one direction or the other, to either heat or cool the support platform 13 as may be required to bring the temperature of the bubbler container to the temperature set point. The various components of the control circuit except, the thermo-electric devices, are preferably located in the components compartment of the housing. A fan 38 is provided below the ambient heat exchanger to pass air thereover.

In the prior thermo-electric temperature controller, the container receiving compartment was insulated in the area surrounding the container with thermal insulation such as rigid plastic foam 45. The thermal insulation material defined a generally cylindrical cavity extending upwardly from the periphery of the container support platform 35 to the top wall 26 to insulate the bubbler container from the surrounding atmosphere and also separate the container receiving compartment above the support platform 35 from the fan compartment below the support platform. The foam insulation is conveniently adhesively bonded to the walls of the housing and partition that define the container receiving compartment and is separated along lines 45a, 45b and 45c at the edges of the door so that a portion of the insulation 45 swings with the door while the remaining portion of the insulation is fit in the housing.

In accordance with the present invention, a heat exchanger is provided for the side walls of the bubbler container and the heat exchanger is constructed and arranged to allow movement of the bubbler container laterally through the access opening in the housing onto and off of the container support platform. The heat exchanger includes a first semi-cylindrical heat exchange member 51 mounted on the container support platform in heat exchange relation therewith and a second semicylindrical heat exchange member 51' that is movable through the access opening in the housing into and out of an enclosure forming position with the first heat exchange member. The first and second heat exchange members are of similar configuration and like numerals followed by the postscript ' are used to designate parts of the second exchange member that correspond to parts of the first heat exchange member. Thus, the first and second heat exchange members have concave semi-cylindrical inner side faces 52, 52', a pair of lengthwise extending side edges 53, 53' and upper and lower end edges 54, 55 and 54', 55'. The first heat exchange member is mounted at its lower end on the container support platform 35 in heat exchange relation therewith and with its open side facing toward the access opening in the housing to allow the container 10 to be moved laterally through the access opening in the housing into and out of a position On the platform. The heat exchange platform 35 is preferably provided with an annular recess or step 35a which receives and locates the lower end portion of the heat exchange members and the first heat exchange member is secured to the platform as by fasteners and epoxy of a type to provide good thermal heat exchange between the platform and the first heat exchange member. The second heat exchange member 51' is movable between an enclosure forming position as shown in FIG. 1 and an open position as shown in FIG. 2. In the enclosure forming position, the lower end of the second heat exchanger 51' engages the shoulder 35a on the container support platform 35 and the side edges 53' of the second heat exchange member engage respective ones of the side edges 53 of the first heat exchange member to provide a cylindrical enclosure around the bubbler container.

Means are provided on the first and second heat exchanges for removably retaining the second heat exchanger in its enclosure forming position. In the preferred embodiment illustrated, the side edges of the first heat exchange member each define a line that zigzags longitudinally of the first heat exchange member and the side edges of the second heat exchange member also each define a line that zigzags longitudinally of the second heat exchange member and in a manner such that the longitudinal side edges of the second heat exchange member are complementary to a respective one of the side edges of the first heat exchange member. The heat exchange members 51 and 51' are preferably dimensioned to define an inner wall that is only slightly larger than the outer diameter of the bubbler container 10, and the zigzag lines defined by the side edges of the first and second heat exchange members are preferably formed so that they zigzag approximately equal distances from a plane through the longitudinal centerline of the semi-cylindrical inner face of the respective heat exchange member, and shown in phantom in FIGS. 3 and 4 and designated DP. The plane DP is a diametral plane through the open side of the respective heat exchange member and the side edges 53 of the first heat exchange member include at least one and preferably several edge portions designated 53b and 53d that define an upwardly facing cam surface that extends across the diametral plane DP and is inclined at a preselected acute angle to the horizontal. The side edges 53' of the second heat exchange member are each formed with portions 53b' and 53d' that define downwardly facing cam surfaces that extend across the diametral plane DP and which are inclined upwardly and inwardly of the second heat exchange member at the same preselected acute angle to the horizontal. The downwardly facing cam surfaces defined by portions 53b' and 53d' of the second heat exchange member are operative to engage the upwardly facing cam surfaces 53b 53d respectively on the first heat exchange member to guide the second heat exchange member laterally toward the first heat exchange member as the second heat exchange member moves down to a position in which its lower edge 55' engages the support platform.

As best shown in FIG. 4, the side edge 53 of the first heat exchange member has a portion 53a that extends from the lower end of the portion 53b to the upper edge 54 of the first heat exchange member, and a portion 53c that extends from the upper edge of the portion 53b to the lower edge of the portion 53d, and another portion 53e that extends from the upper edge of the portion 53d to the lower edge 55 of the first exchange member. Portions 53a', 53c' and 53e' of the second heat exchange member are formed complementary to the portions 53a, 53c, and 53e respectively of the first heat exchange member so as to engage and form a generally continuous cylinder when the second heat exchange member is in its enclosure forming position. The preselected angle is preferably made such that the second heat exchange member can gravitate downwardly while the interengaging cam surfaces cam the second heat exchange member laterally toward the first heat exchange member and the angle may, for example, be of the order of 45° to the horizontal. The remaining portions of the side edges of the first and second heat exchange members are disposed at an angle to the horizontal substantially greater than the preselected angle. Preferably, the edge portions 53a and 53a' intersect the upper side edges of the respective first and second heat exchange members along the diametral plane DP and, similarly, the portions 53e, 53e' intersect the lower side edges of the respective heat exchange member adjacent the diametral plane DP. The portions 53c, 53c' cross the diametral plane at a location intermediate the portions 53b and 53d.

The first and second heat exchange members are preferably formed from a single cylinder of thermally conductive material by forming a diametral cut longitudinally of the cylinder along a zigzag line to provide the aforementioned complementary zigzag side edges on the first and seond heat exchange members. The cylinder may, for example, be cut on an electric discharge machine using a wire of the order of 10 mils. Forming the heat exchange members in this manner assures that the semi-cylindrical sections of the heat exchanger will have complementary side edges to closely interfit and form a complete cylinder in their enclosure forming position.

From the foregoing it is thought that the construction and operation of the thermo-electric temperature controller will be readily understood. The first heat exchange member 51 is fixedly mounted at its lower end on the platform 35 of thermally conductive material in heat exchange relation therewith and with its open side facing toward the access opening in the side of the housing to allow the bubbler container to be moved laterally through the access opening into and out of a position on the container support platform. The second heat exchange member can be moved through the access opening in the housing and into opposed relation with the first heat exchange member to form a heat exchange enclosure therewith, with the lower end of the second heat exchange member engaging the thermally conductive container support platform and with the side edges of the second heat exchange member engaging the side edges of the first heat exchange member. The side edges of the first and second heat exchange members are formed so as to define zigzag lines which provide interengaging cam surfaces for camming the second heat exchange member laterally toward the first heat exchange member as the second heat exchange member moves down into engagement with the platform. The zigzag lines defined by the side edges of the heat exchange members are preferably arranged so that the apices of the zigzag line are disposed substantially equal distances from a diametral plane through the open sides of the heat exchange members so as to minimize the amount that each heat exchange member exceeds 180°, and to thereby minimize interference between the heat exchange members and the bubbler container during installation and removal of the bubbler container from the housing.

The embodiments of the invention in which an exclusive property or privilege is claimed are defined as follows:

1. A thermo-electric temperature controller for liquid chemical bubbler containers of the type having a bottom wall, a generally cylindrical side wall and a top wall with inlet and outlet fittings, a housing for enclosing the bubbler container and having top wall means and side wall means extending downwardly around the perimeter of the top wall means, a thermally conductive platform in the housing for supporting a bubbler container in heat exchange relation therewith, means including at least one thermo-electric device having a first thermal junction in heat exchange relation with the underside of the platform and a second thermal junction in heat exchange with an ambient heat exchanger for cooling or heating of the platform, the top wall means of the housing having an opening above the platform to allow the inlet and outlet fittings of a bubbler container to extend therethrough, the side wall means and top wall means of the housing including a door portion movable laterally of the housing between a closed position and an open position, said door portion in its open position providing an access opening in the side wall means of the housing of a size sufficient to allow movement of a bubbler container laterally into and out of the housing, first and second heat exchange members of thermally conductive material each having a semi-cylindrical inner side face, a pair of lengthwise extending side edges, and upper and lower end edges, the first heat exchange member having its lower end mounted on the platform in heat exchange relation therewith and with its concave inner side face facing toward the access opening in the housing to extend around one side of a bubbler container on the platform, the second heat exchange member being movable through the access opening in the housing into an enclosure forming position in which the concave inner side face of the second heat exchange member is in opposed relation with the concave inner side of the first heat exchange member to form a cylindrical heat exchange enclosure therewith, and means for releasably retaining the second heat exchange member in said enclosure forming position with the lengthwise extending side edges of the first and second heat exchange members in heat exchange relation with each other and with the lower end edge of the second heat exchange member in heat exchange relation with the platform.

2. A thermo-electric temperature controller according to claim 1 wherein said means for releasably retaining said second heat exchange member in said enclosure forming position includes cam means on the first and second heat exchange members constructed and arranged to allow the second heat exchange member to gravitationally move downwardly into engagement with the platform and to cam the second heat exchange member laterally toward the first heat exchange member as the second heat exchange member moves downwardly into engagement with the platform.

3. A thermo-electric temperature controller according to claim 1 wherein said means for releasably retaining said second heat exchange member in said enclosure forming position includes interengaging cam means on the side edges of the first and second heat exchange members, the interengaging cam means being constructed and arranged to interengage and prevent movement of the second heat exchange member into said enclosure forming position until the second heat exchange member is moved to an intermediate position relative to the first heat exchange member in which the lower end of the second heat exchange member is spaced above the platform, the interengaging cam means being constructed and arranged to allow the second heat exchange member to move downwardly from the intermediate portion into engagement with the platform while camming the second heat exchange member laterally toward the first heat exchange member as the second heat exchange member moves downwardly.

4. A thermo-electric temperature controller according to claim 1 wherein each of the side edges of the first heat exchange member defines a longitudinally zigzag line and each of the side edges of the second heat exchange members form a longitudinally zigzag line complementary to a respective side edge of the first heat exchange member and such that the first and second heat exchange members interfit and form a generally continuous cylindrical wall when the second heat exchange member is in its enclosure forming position, the side edges of the first heat exchange member each having at least one portion that defines an upwardly facing cam surface that is inclined downwardly and inwardly of the first heat exchange member, the side edges of the second heat exchange member each having at least one portion that defines a downwardly facing cam surface that is inclined upwardly and inwardly of the second heat exchange member, the downwardly facing cam surface on the second heat exchange member and the upwardly facing cam surface on the first heat exchange member being constructed and arranged to allow the second heat exchange member to gravitationally move downwardly and to cam the second heat exchange member laterally toward the first heat exchange member as the second heat exchange member moves downwardly to said enclosure forming position.

5. A thermo-electric temperature controller according to claim 4 wherein the zigzag line defined by the side edges of the first heat exchange member deviates substantially equal distances from opposite sides of a plane through the longitudinal centerline of the semicylindrical inner side face of the first heat exchange member, the zigzag line defined by the side edges of the second heat exchange member deviates substantially equal distances from opposite sides of a plane through the longitudinal centerline of the semi-cylindrical inner side face of the second heat exchange member.

6. A thermo-electric controller according to claim 4 wherein the first and second heat exchange members are formed by cutting a cylindrical sleeve lengthwise along a zigzag line.

7. A thermo electric temperature controller according to claim 5 wherein each of the side edges of the first heat exchange member defines at least two of said upwardly facing cam surfaces at locations spaced apart along the first heat exchange member, each of the side edges of the second heat exchange member defines at least two of said downwardly facing cam surfaces at locations spaced apart along the second heat exchange member.

8. A thermo-electric temperature controller according to claim 1 wherein said housing is of generally rectangular configuration having front and rear walls and first and second end walls, said door portion of the housing including a portion of the front wall and a portion of one end wall, and means hingedly mounting the door portion on said one end wall for swinging movement about an upright axis between said closed and said open position.

9. A thermo-electric temperature controller for a liquid chemical bubbler container of the type having a bottom wall, a generally cylindrical side wall and a top wall with inlet and outlet fittings, a housing for enclosing the bubbler container and having top wall means and side wall means extending downwardly around the perimeter of the top wall means, a thermally conductive platform in the housing for supporting a bubbler container in heat exchange relation therewith, at least one thermo-electric device having a first thermal junction in heat exchange relation with the underside of the platform and a second thermal junction in heat exchange with an ambient heat exchanger, the top wall means of the housing having an opening above the platform means to allow the inlet and outlet fittings of a bubbler container to extend therethrough, the side wall means and top wall means of the housing including a door portion movable laterally of the housing between a closed position and an open position, said door portion in its open position providing an access opening in the side wall means of the housing of a size sufficient to allow movement of a bubbler container laterally into and out of the housing, first and second heat exchange members of thermally conductive material and each having a concave semi-cylindrical inner side face, a pair of lengthwise extending side edges, and upper and lower end edges, the first heat exchange member having its lower end mounted on the platform in heat exchan9e relation therewith and with its concave inner side facing toward the access opening in the housing to extend around one side of a bubbler container on the platform, the second heat exchange member being movable through the access opening in the housing into an enclosure forming position in which the concave inner side of the second heat exchange member is in opposed relation with the concave inner side of the first heat exchange member to form a cylindrical heat exchange enclosure therewith, the side edges of the first heat exchange member each defining a line that zigzags longitudinally of the first heat exchange member substantially equal distances from opposite sides of a first plane through the longitudinal centerline of the semicylindrical inner face of the first heat exchange member, the side edges of the second heat exchange member each defining a line that zigzags substantially equal distances from opposite sides of a second plane through the longitudinal centerline of the semi-cylindrical inner face of the second heat exchange member, the side edges of the second heat exchange member being complementary to a respective side edge of the first heat exchange member to interfit and form a generally continuous cylinder when the second heat exchange member is in the enclosure forming position, the side edges of the first heat exchange member each having at least one portion that defines an upwardly facing cam surface that extends across said first plane and is inclined at an acute angle to the horizontal downwardly and inwardly of the first heat exchange member, the side edges of the second heat exchange member each having at least one portion that defines a downwardly facing cam surface that extends across said second plane and is inclined at an acute angle to the horizontal upwardly and inwardly of the second heat exchange member, the downwardly facing cam surface on the second heat exchange member being operative to engage the upwardly facing cam surface on the first heat exchange member to guide the second heat exchange member laterally toward the first heat exchange member and into said enclosure forming position.

10. A thermo-electric temperature controller according to claim 9 wherein each of the side edges of the first heat exchange member defines at least two of said upwardly facing cam surfaces at locations spaced apart along the first heat exchange member, each of the side edges of the second heat exchange member defines at least two of said downwardly facing cam surfaces at locations spaced apart along the second heat exchange member.

11. A thermo-electric temperature controller according to claim 9 wherein said housing is of generally rectangular configuration having front and rear walls and first and second end walls, said door portion of the housing including a portion of the front wall and a portion of one end wall, and means hingedly mounting the door portion on said one end wall for swinging movement about an upright axis between said closed and said open position.

* * * * *